(12) United States Patent
Cho

(10) Patent No.: US 8,759,893 B2
(45) Date of Patent: Jun. 24, 2014

(54) HORIZONTAL INTERDIGITATED CAPACITOR STRUCTURE WITH VIAS

(75) Inventor: Hsiu-Ying Cho, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 166 days.

(21) Appl. No.: 13/227,242

(22) Filed: Sep. 7, 2011

(65) Prior Publication Data
US 2013/0056853 A1    Mar. 7, 2013

(51) Int. Cl.
| | |
|---|---|
| *H01L 29/94* | (2006.01) |
| *H01L 29/66* | (2006.01) |
| *H01L 29/00* | (2006.01) |
| *H01L 21/02* | (2006.01) |

(52) U.S. Cl.
USPC ........... 257/308; 257/277; 257/303; 257/301; 257/516; 257/532; 257/535

(58) Field of Classification Search
USPC ......... 257/277, 296, 301, 303, 308, 309, 516, 257/532, 534, 535, E27.016, E27.017, 257/E27.019–E27.025, E27.03–E27.034, 257/E27.037, E27.038, E27.043–E27.045, 257/E27.048, E27.071, E29.218, E29.342, 257/E29.343, E21.008
See application file for complete search history.

(56) References Cited

U.S. PATENT DOCUMENTS

| | | | | |
|---|---|---|---|---|
| 6,383,858 B1 * | 5/2002 | Gupta et al. | ................. | 438/238 |
| 6,743,671 B2 * | 6/2004 | Hu et al. | ....................... | 438/253 |
| 7,485,912 B2 * | 2/2009 | Wang | ........................... | 257/307 |
| 2002/0093780 A1 * | 7/2002 | Hajimiri et al. | ............ | 361/306.1 |
| 2007/0158783 A1 * | 7/2007 | Chen et al. | ..................... | 257/534 |
| 2010/0141354 A1 * | 6/2010 | Cho | .............................. | 333/160 |
| 2010/0214041 A1 | 8/2010 | Cho | | |

OTHER PUBLICATIONS

Unpublished U.S. Appl. No. 13/272,866, filed Oct. 13, 2011 entitled "Vertically Oriented Semiconductor Device and Shielding Structure Thereof," 38 pages.
Unpublished U.S. Appl. No. 13/280,786, filed Oct. 25, 2011 entitled "Structure and Method for a High-K Transformer with Capacitive Coupling," 39 pages.
Kawano, Yoichi, et al., "A 77GHz Transceiver in 90nm CMOS," 2009 IEEE International Solid-State Circuits Conference, 978-1-4244-3457-2/09, ISSCC 2009/Session 18/Ranging and Gb/s Communication/18.3, 3 pages.

(Continued)

*Primary Examiner* — Steven Loke
*Assistant Examiner* — Juanita B Rhodes
(74) *Attorney, Agent, or Firm* — Haynes and Boone, LLP

(57) ABSTRACT

The present disclosure provides a semiconductor device. The semiconductor device includes a substrate having a surface that is defined by a first axis and a second axis perpendicular to the first axis; and a capacitor disposed on the substrate, the capacitor having an anode component that includes a plurality of first conductive features and a cathode component that includes a plurality of second conductive features. The first conductive features and the second conductive features each include two metal lines extending along the first axis. At least one metal via extending along a third axis that is perpendicular to the surface of the substrate and interconnecting the two metal lines. The first conductive features are interdigitated with the second conductive features along both the second axis and the third axis.

21 Claims, 18 Drawing Sheets

(56) References Cited

OTHER PUBLICATIONS

Lim, Chee Chong, et al., "Fully Symmetrical Monolithic Transformer (True 1:1) for Silicon RFIC," IEEE Transactions on Microwave Theory and Techniques, vol. 56, No. 10, Oct. 2008, pp. 2301-2311.

Unpublished U.S. Appl. No. 13/212,987, filed Aug. 18, 2011 entitled "Vertically Oriented Semiconductor Device and Shielding Structure Thereof," 45 pages.

Unpublished U.S. Appl. No. 13/212,976, filed Aug. 18, 2011 entitled "Vertically Oriented Semiconductor Device and Shielding Structure Thereof," 44 pages.

Unpublished U.S. Appl. No. 13/158,044, filed Jun. 10, 2011 entitled "A Vertical Interdigitated Semiconductor Capacitor", 33 pages.

Unpublished U.S. Appl. No. 13/212,982, filed Aug. 20, 2011 entitled "Vertically Oriented Semiconductor Device and Shielding Structure Thereof", 44 pages.

Unpublished U.S. Appl. No. 13/411,052, filed Mar. 2, 2012 entitled "Structure and Method for a Fishbone Differential Capacitor," 38 pages.

* cited by examiner

HORIZONTAL INTERDIGITATED CAPACITOR STRUCTURE WITH VIAS

CROSS-REFERENCE

The present disclosure is related to the following commonly-assigned U.S. patent applications, the entire disclosures of which are incorporated herein by reference: U.S. Ser. No. 13/158,044 filed Jun. 10, 2011 by inventors Hsiu-Ying Cho for "A VERTICAL INTERDIGITATED SEMICONDUCTOR CAPACITOR"; U.S. Ser. No. 13/212,982 filed Aug. 20, 2011 by inventor Hsiu-Ying Cho for "VERTICALLY ORIENTED SEMICONDUCTOR DEVICE AND SHIELDING STRUCTURE THEREOF"; U.S. Ser. No. 13/280,786 filed Oct. 25, 2011 by inventor Hsiu-Ying Cho for "STRUCTURE AND METHOD FOR A HIGH-K TRANSFORMER WITH CAPACITIVE COUPLING"; and U.S. Ser. No. 13/272,866 filed Oct. 13, 2011 by inventor Hsiu-Ying Cho for "VERTICALLY ORIENTED SEMICONDUCTOR DEVICE AND SHIELDING STRUCTURE THEREOF".

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component or line that can be created using a fabrication process) has decreased.

Various active or passive electronic components can be formed on a semiconductor IC. For example, a semiconductor capacitor may be formed as a passive electronic component. Traditionally, a semiconductor capacitor may have a metal-on-metal (MOM) structure. As device sizes continue to decrease, the MOM structure for traditional semiconductor capacitors may encounter problems such as excessive area consumption, low capacitance density, and/or high fabrication costs.

Therefore, while existing semiconductor capacitor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
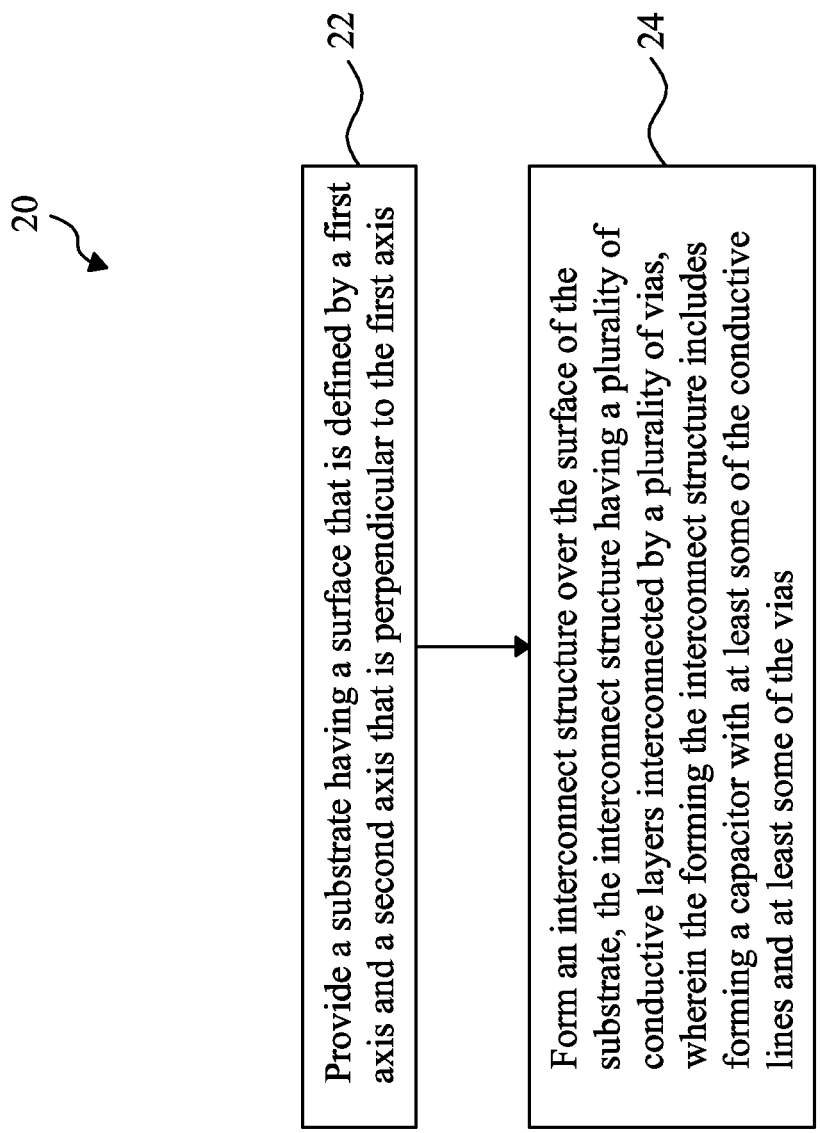
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
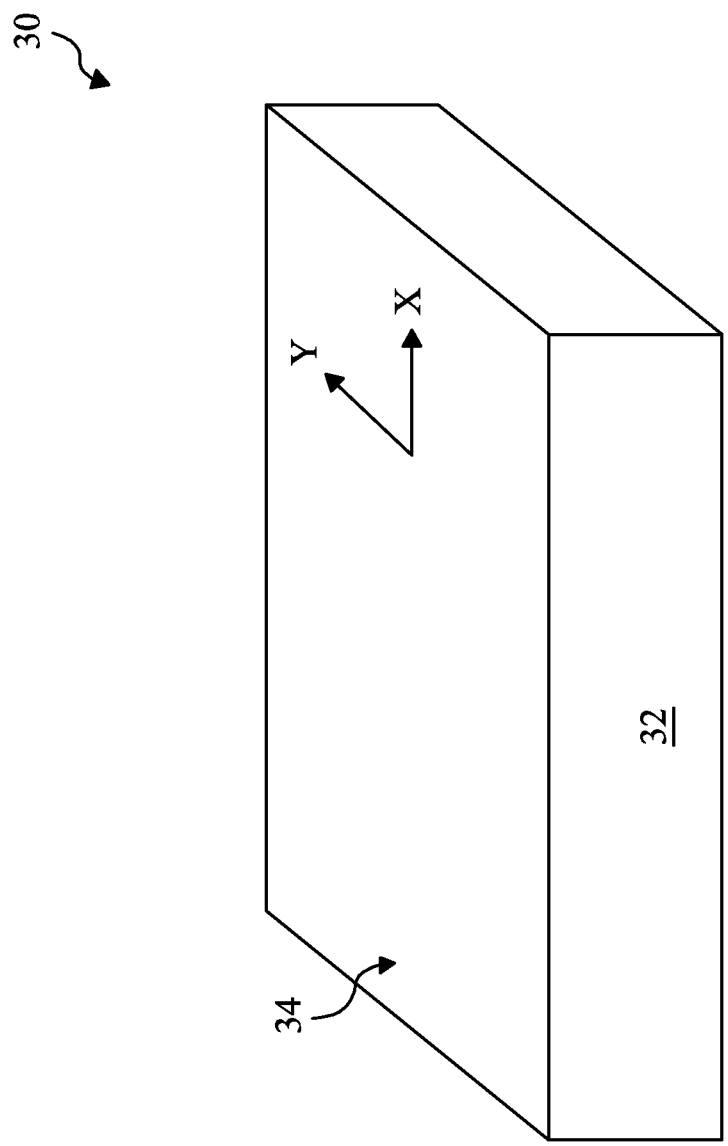
FIGS. 2-3 are diagrammatic fragmentary cross-sectional side views of a semiconductor device at different stages of fabrication.
Figure 3:
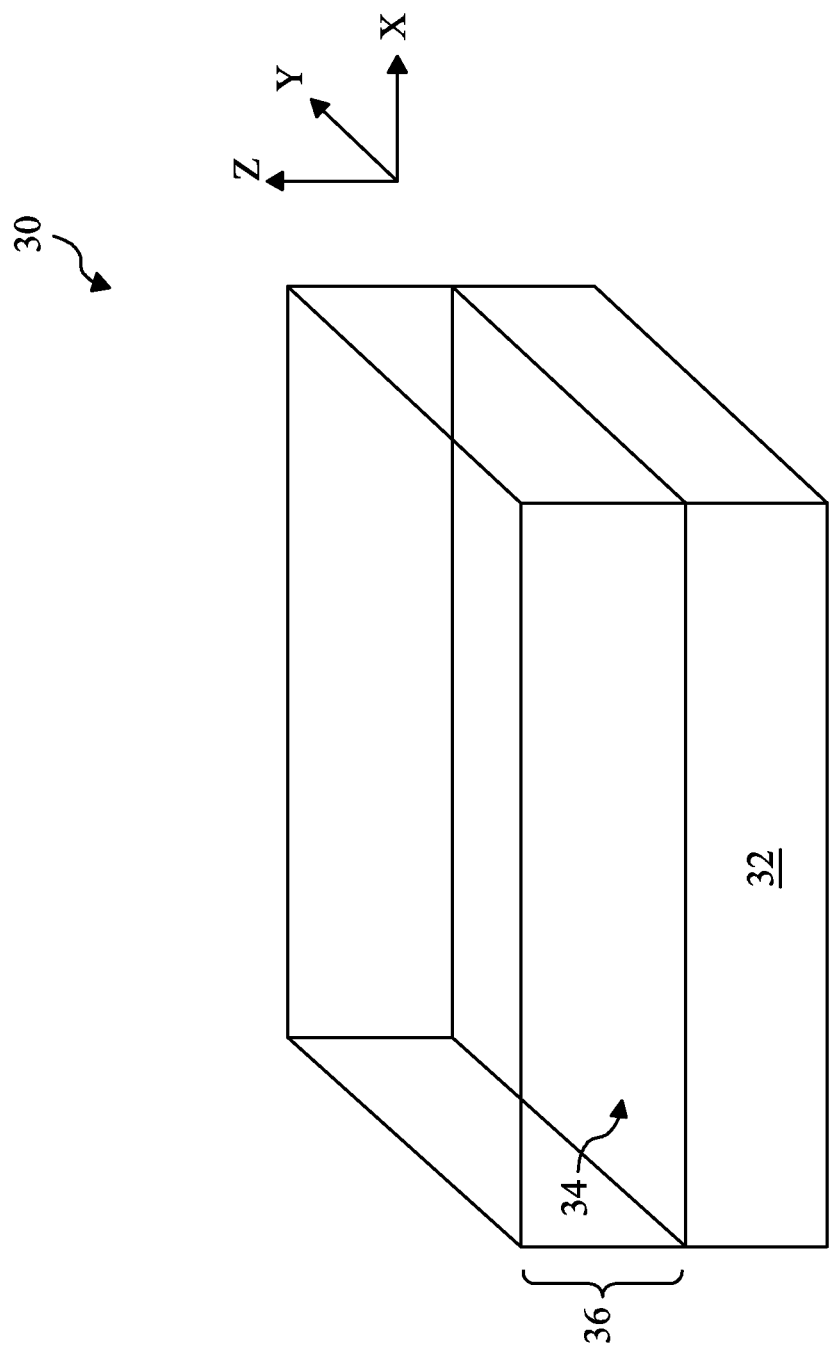

Illustrated in FIG. 1 is a flowchart of a method 20 for fabricating a semiconductor device that includes a capacitor structure. FIGS. 2 and 3 are diagrammatic fragmentary cross-sectional side views of a semiconductor device 30 fabricated according to the various aspects of the present disclosure. The semiconductor device 30 and the method 20 making the same are collectively described with references to FIGS. 1 through 3.

The semiconductor device 30 may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that the Figures discussed herein have been simplified for a better understanding of the inventive concepts of the present disclosure. Accordingly, it should be noted that additional processes may be provided before, during, and after the method 20 of FIG. 1, and that some other processes may only be briefly described herein.

Referring to FIGS. 1 and 2, the method 20 begins with block 22 in which a substrate 32 is provided. In one embodiment, the substrate 32 is a silicon substrate doped with either a P-type dopant such as boron, or doped with an N-type dopant such as arsenic or phosphorous. The substrate 32 may be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 32 could include an epitaxial layer (epi layer), may be strained for performance enhancement, and may include a silicon-on-insulator (SOI) structure.

Although not specifically shown for the sake of simplicity, a plurality of electronic components may be formed in the substrate 32. For example, source and drain regions of FET transistor devices may be formed in the substrate. The source and drain regions may be formed by one or more ion implantation or diffusion processes. As another example, isolation structures such as shallow trench isolation (STI) structures or deep trench isolation (DTI) structures may be formed in the substrate to provide isolation for the various electronic components. These isolation structures may be formed by etching recesses (or trenches) in the substrate 32 and thereafter filling the recesses with a dielectric material, such as silicon oxide, silicon nitride, silicon oxy-nitride, fluoride-doped silicate (FSG), and/or a low-k dielectric material known in the art.

The substrate 32 has an upper surface 34. The surface 34 is a two-dimensional plane that is defined by an X-axis and a Y-axis, where the X-axis and Y-axis are perpendicular, or orthogonal, to each other. The X-axis and the Y-axis may also be referred to as an X-direction and a Y-direction, respectively.

Referring to FIGS. 1 and 3, the method 20 begins with block 24 in which an interconnect structure 36 is formed over the upper surface 34 of the substrate 32. In other words, the interconnect structure 36 is disposed over the surface 34 in a Z-axis, or a Z-direction that is perpendicular to the surface 34. The interconnect structure 36 includes a plurality of patterned dielectric layers and interconnected conductive layers. These interconnected conductive layers provide interconnections (e.g., wiring) between circuitries, inputs/outputs, and various doped features formed in the substrate 32. In more detail, the interconnect structure 36 may include a plurality of interconnect layers, also referred to as metal layers (e.g., M1, M2, M3, etc). Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 36 includes an interlayer dielectric (ILD) layer that provides isolation between the first metal layer and the substrate and include inter-metal dielectric (IMD) layers that provide isolation between the metal layers. The ILD and IMD layers may include a dielectric material such as an oxide material. The interconnect structure 36 also includes a plurality of vias/contacts that provide electrical connections between the different metal layers and/or the features on the substrate. For the sake of simplicity, the metal lines in the interconnect layers, the vias/contacts interconnecting the metal lines, and the dielectric material separating them are not specifically illustrated herein.

The interconnect structure 36 is formed in a manner such that a capacitor is formed in the interconnect structure. The capacitor is formed with at least some of the conductive lines and at least some of the vias of the interconnect structure. The capacitor is formed to have an anode component and a cathode component. The anode component includes a plurality of first conductive features. The cathode component includes a plurality of second conductive features. The first conductive features and the second conductive features each include two metal lines extending along the X axis; and at least one metal via extending along the Z axis that is perpendicular to the surface of the substrate and interconnecting the two metal lines. The first conductive features are interdigitated with the second conductive features along both the Y axis and the Z axis.

According to various aspects of the present disclosure, an interdigitated capacitor structure is formed in the interconnect structure 36. Or stated differently, various components of the interconnect structure 36 constitute the interdigitated capacitor disclosed herein. The capacitor structure is not shown in FIG. 3 for the sake of simplicity, but its various embodiments are illustrated in more detail in FIGS. 4 through 20 and will be discussed in more detail by the following paragraphs.

Figure 4:
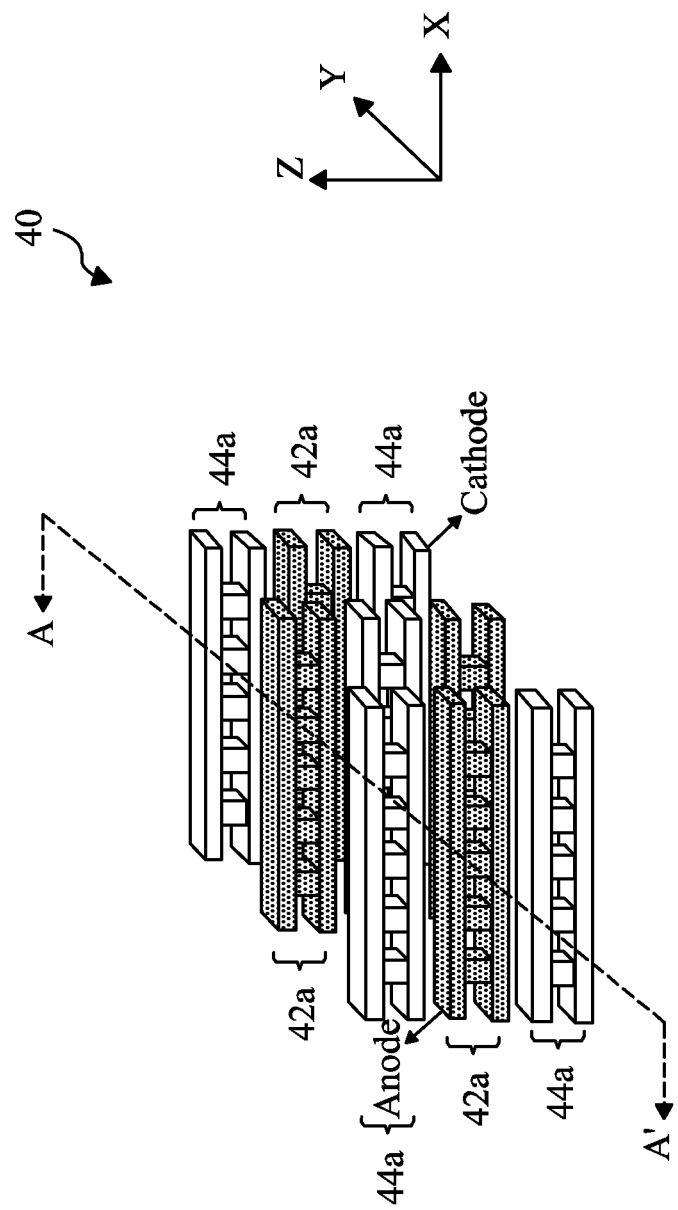
FIG. 4 is a perspective fragmentary view of a semiconductor capacitor in one embodiment.

Referring now to FIG. 4, a fragmentary (partial) perspective view of an embodiment of the interdigitated capacitor structure 40 is illustrated according to aspects of the present disclosure. The capacitor structure 40 includes an anode component 42 and a cathode component 44. The anode component 42 and the cathode component 44 respectively serve as anode and cathode terminals of the capacitor structure 40, so that an electrical voltage can be applied through the anode and cathode terminals. Stated differently, when the capacitor structure 40 is in operation (functioning as a capacitor), one voltage will be applied throughout the anode component 42, while a different voltage will be applied throughout the cathode component 44. The anode and cathode components 42 and 44 may be considered opposite electrodes or may be said to have different polarities. It is also understood that the relative configuration of the anode and cathode components 42 and 44 is not critical. For example, the anode and cathode components 42 and 44 may be rotated, flipped, or switched in other embodiments.

It is also understood that the dielectric material of the interconnect structure 36 serves as the dielectric between the anode and cathode electrodes of the capacitor structure 40. In FIG. 4, the dielectric material separates and electrically isolates the various parts of the anode component 42 from the various parts of the cathode component 44. Depending on the need and function to be performed by the capacitor structure 40, the dielectric material of the interconnect structure 36 can be carefully chosen so as to effect the desired capacitance. For example, the capacitance for a parallel plate capacitor can be calculated with the following equation:

$$C = \varepsilon_r \varepsilon_0 \frac{A}{d}$$

where C is the capacitance; A is the area of overlap of the two plates; $\varepsilon_r$ is the dielectric constant of the material between the plates; $\varepsilon_0$ is the electric constant ($\varepsilon_0 \approx 8.854 \times 10^{-12}$ F m$^{-1}$); and d is the separation between the plates. As such, if a high capacitance capacitor is desired, the dielectric material of the interconnect structure can be chosen to have a high dielectric constant.

The anode component 42 and the cathode component 44 each include a plurality of (or arrays of) conductive features (or conductive stacks). Particularly, the anode component 42 includes a plurality of first conductive features 42a. The cathode component 44 includes a plurality of second conductive features 44a. According to various aspects of the present disclosure, these conductive stacks 42a and 44a each include two metal lines extending along the first axis; and at least one metal via extending along the Z axis and interconnecting the two metal lines. The first conductive features 42a are interdigitated with the second conductive features 44a along both the Y axis and the Z axis.

Figure 5:
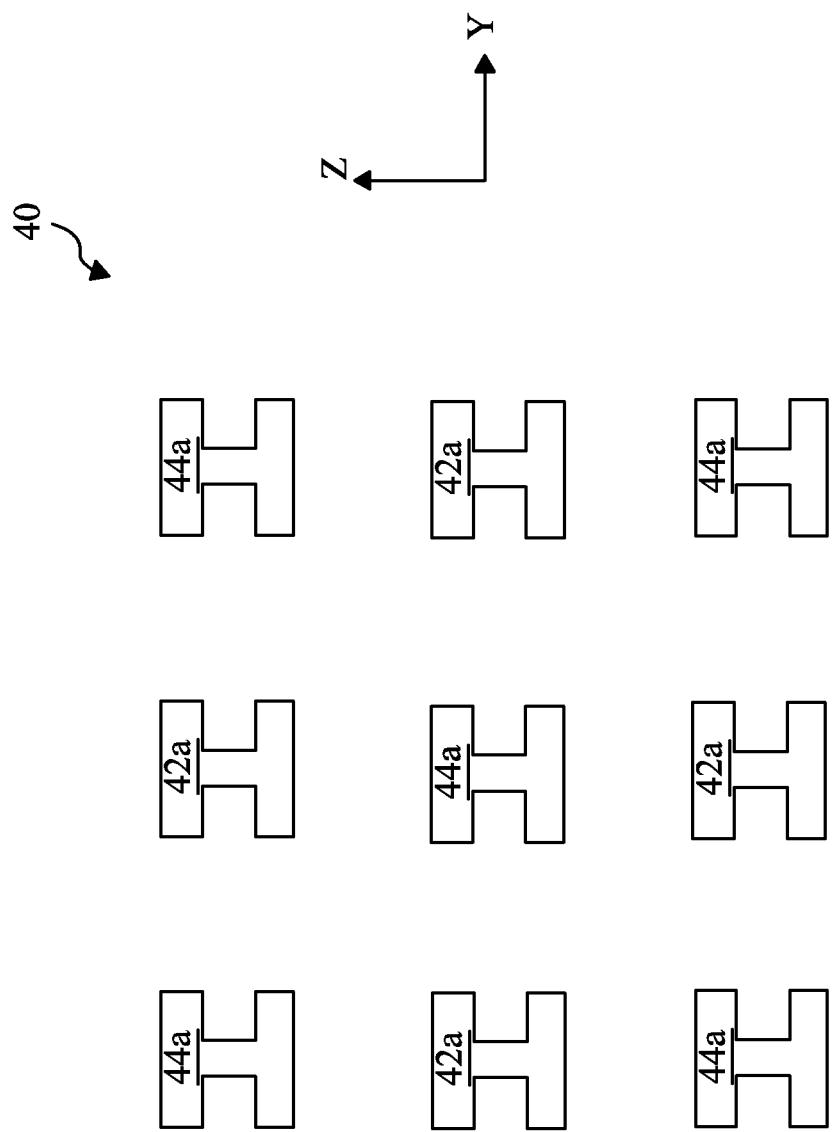
FIG. 5 is a sectional view of the semiconductor capacitor of FIG. 4.

The capacitor structure 40 is further described with reference to FIGS. 5 through 8. FIG. 5 is a sectional view of the capacitor structure 40 cut from the virtual line AA'. Specifically, the sectional view in FIG. 5 is taken from the virtual line AA' in FIG. 4. The capacitor 40 includes a plurality of first conductive features 42a and a plurality of second conductive features 44a configured as an array in the plane defined by the Y axis and the Z axis. The first conductive features 42a are interdigitated with the second conductive features 44a along the Y axis and the Z axis. State differently, the array includes a first subset of the first conductive features 42a and the second conductive features 44a aligned along the Y axis. The first conductive features 42a in the first subset are interdigitated with the second conductive features 44a in the first subset along the Y axis. The array further includes a second subset of the first conductive features 42a and the second conductive features 44a aligned along the Z axis. The first conductive features 42a in the second subset are interdigitated with the second conductive features 44a in the second subset along the Z axis.

Figure 6:
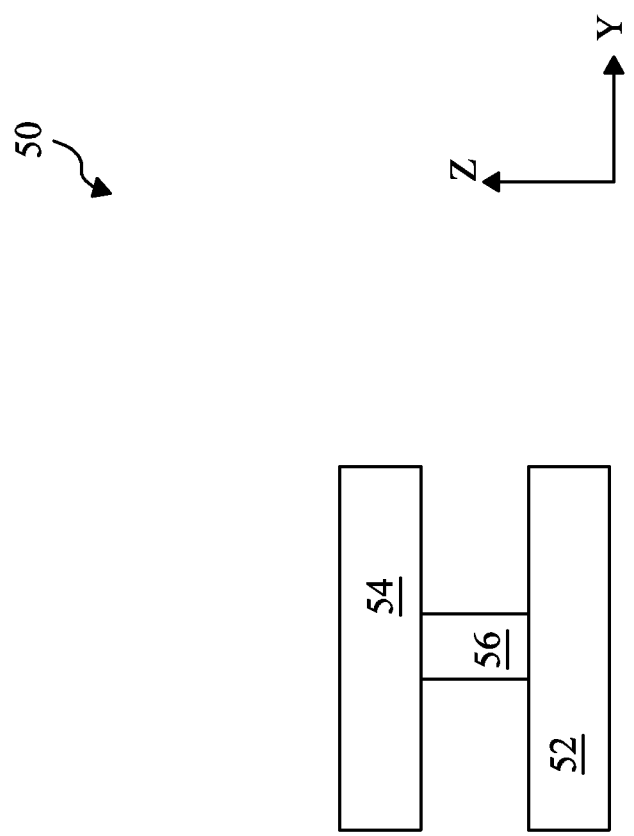
FIG. 6 is a sectional view of a portion of the semiconductor capacitor of FIG. 4.
Figure 7:
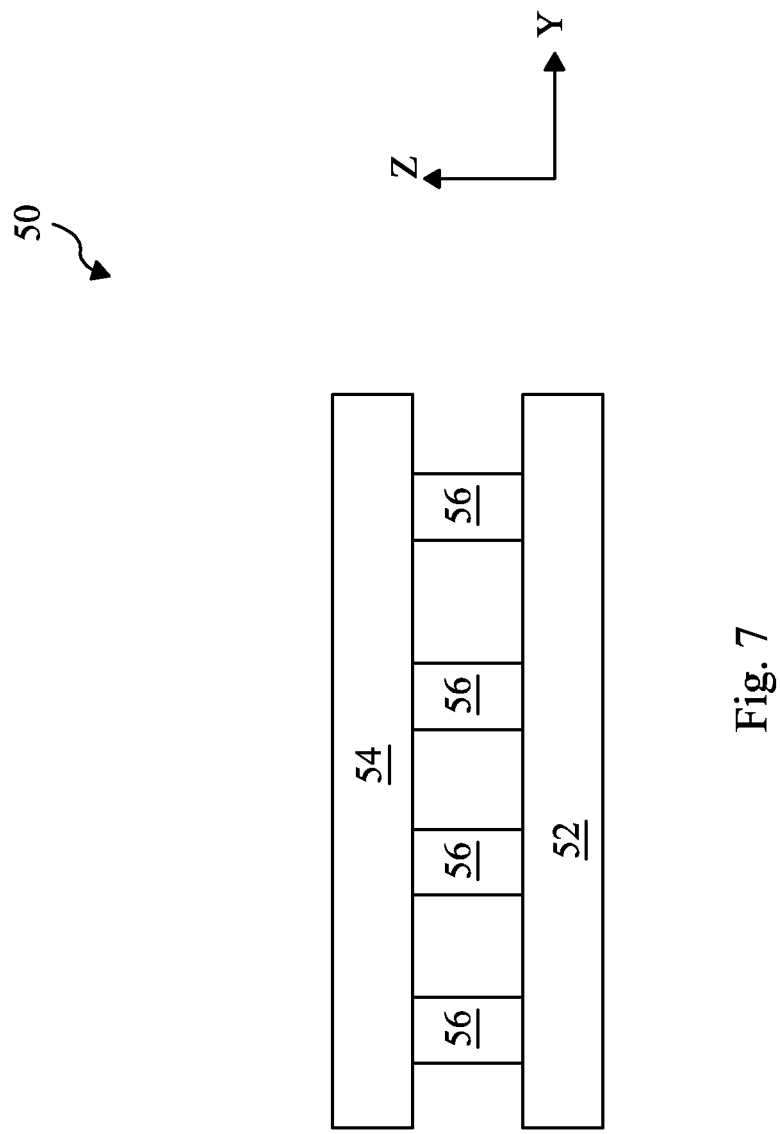
FIG. 7 is a sectional view of a portion of the semiconductor capacitor of FIG. 4 in one embodiment.
Figure 8:
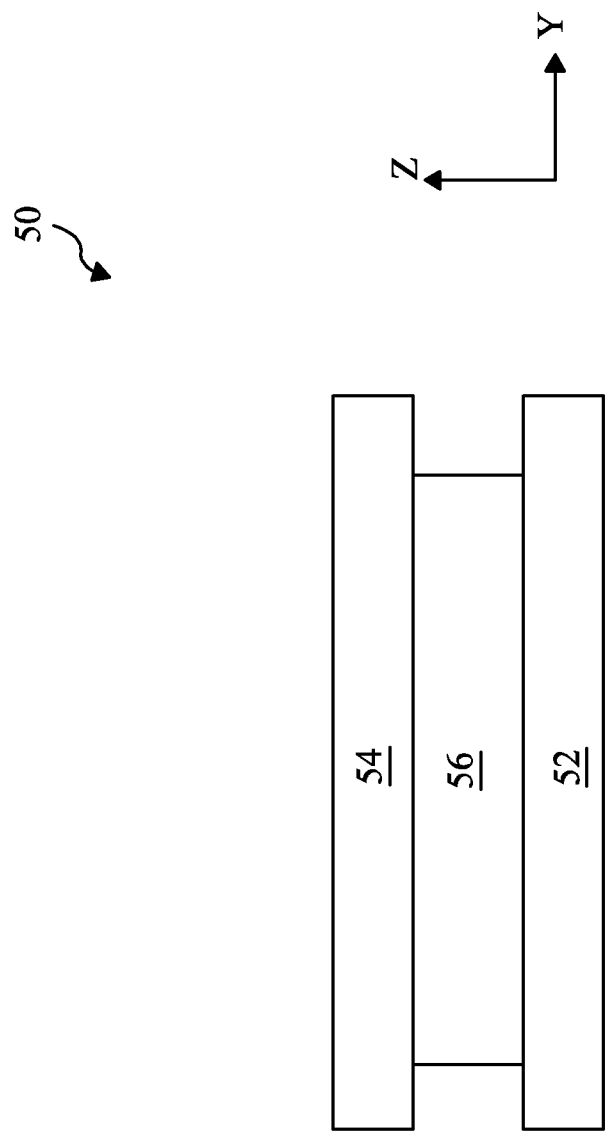
FIG. 8 is a sectional view of a portion of the semiconductor capacitor of FIG. 4 in another embodiment.

Each of the first conductive features 42a and the second conductive features 44a in the capacitor 40 is further illustrated with reference to FIGS. 6 and 8. FIG. 6 is a sectional view of a conductive feature 50 when viewed along the X axis. FIG. 7 is a sectional view of the conductive feature 50 when viewed along the Y axis. FIG. 8 is a sectional view of the conductive feature 50 when viewed along the Y axis. The conductive feature 50 is one of the first conductive features 42a and the second conductive features 44a constructed according to aspects of the present disclosure in various embodiments.

In one embodiment with reference to FIGS. 6 and 7, the conductive feature 50 includes a first metal line 52, a second metal line 54, and one or more via features connecting the first and second metal lines 52 and 54. The first and second metal lines 52 and 54 belong to respective metal layers. For example, the first metal line 52 belongs to a metal layer $M_n$ and the second metal line 54 belongs to another metal layer $M_{n+1}$ overlying the metal layer $M_n$. The first and second metal lines are oriented along the X axis. Each of the first and second metal lines 52 and 54 includes a length defined along the X direction and a width defined along the Y direction. The length is substantially greater than the width. In the present embodiment, the conductive feature 50 includes a plurality of via features 56 configured to connect the first and second conductive features 52 and 54 along the Z direction. The via features 56 each include a first dimension in the X direction and a second dimension in the Y direction. The first dimension is substantially equal to the second dimension.

In another embodiment with reference to FIGS. 6 and 8, the conductive feature 50 includes a first metal line 52, a second metal line 54, and one feature connecting the first and second metal lines 52 and 54. The first and second metal lines 52 and 54 belong to respective metal layers, such as $M_n$ and $M_{n+1}$, respectively. The first and second metal lines are oriented along the X axis. Each of the first and second metal lines 52 and 54 includes a length defined along the X direction and a width defined along the Y direction. The length is substantially greater than the width. In the present embodiment, the conductive feature 50 includes a via feature 56 configured to connect the first and second conductive features 52 and 54 along the Z direction. The via feature 56 includes a first dimension in the X direction and a second dimension in the Y direction. The first dimension is substantially greater than the second dimension. Therefore, the via feature 56, in this embodiment, is also referred to as elongated via feature or via bar.

Figure 9:
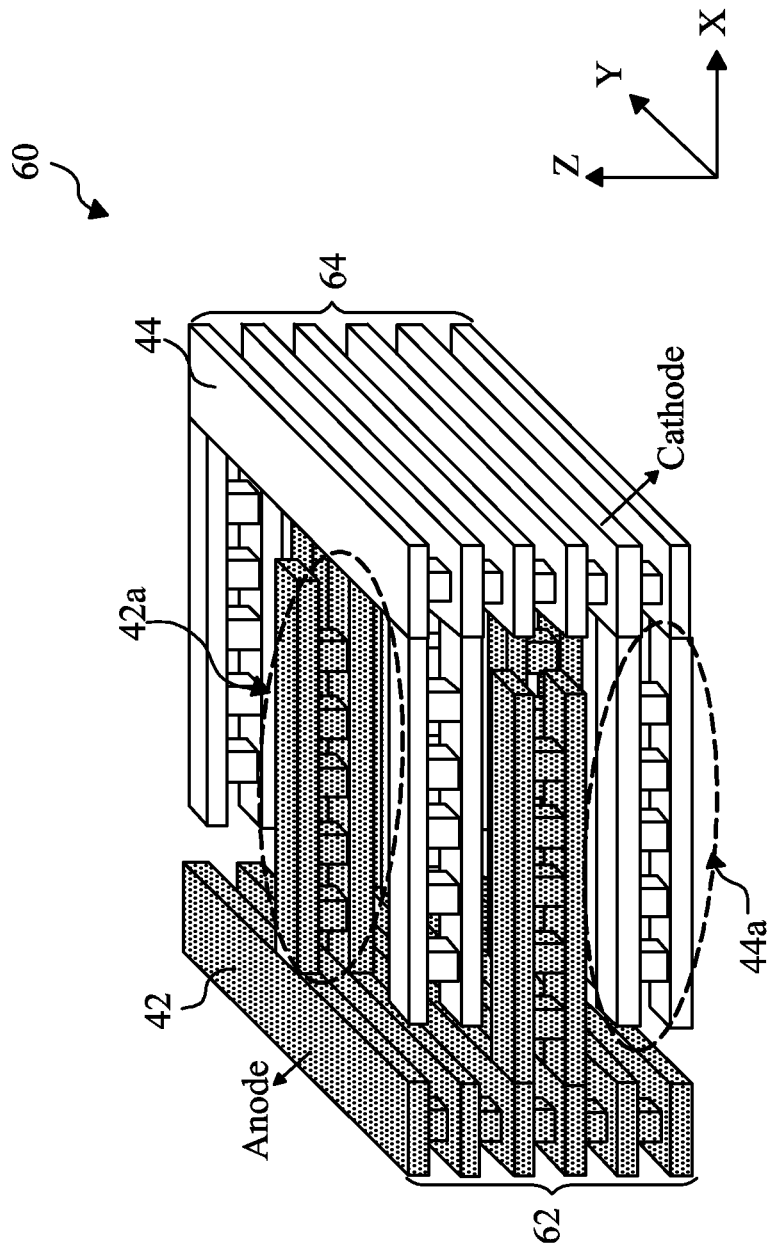
FIG. 9 is a perspective view of a semiconductor capacitor in another embodiment.

Referring now to FIG. 9, a fragmentary perspective view of an interdigitated capacitor structure 60 is illustrated according to aspects of the present disclosure in another embodiment. The capacitor structure 40 includes an anode component 42 and a cathode component 44. The anode component 42 and the cathode component 44 respectively serve as anode and cathode terminals of the capacitor structure 60, so that an electrical voltage can be applied through the anode and cathode terminals. The anode and cathode components 42 and 44 may be considered opposite electrodes or may be said to have different polarities. The anode and cathode components 42 and 44 may be rotated, flipped, or switched in other embodiments.

In the embodiment shown in FIG. 9, the anode component 42 and the cathode component 44 each include a plurality of conductive features. Particularly, the anode component 42 includes a plurality of first conductive features 42a. The cathode component 44 includes a plurality of second conductive features 44a. The first conductive features 42a are interdigitated with the second conductive features 44a along both the Y axis and the Z axis. According to various aspects of the present disclosure, these conductive stacks 42a and 44a each include two metal lines extending along the first axis; and at least one metal via extending along the Z axis and interconnecting the two metal lines. In one embodiment, at least a subset of the conductive stacks 42a and 44a is similar to the conductive feature 50 in FIG. 7. In another embodiment, at least a subset of the conductive stacks 42a and 44a is similar to the conductive feature 50 in FIG. 8.

The anode component 42 also includes a side portion 62, and the cathode component 44 also includes a side portion 64. The side portions 62 and 64 each include a plurality of metal lines interconnected vertically (in the Z-direction) by vias, where the metal lines extend in the Y direction. The metal lines in the side portions 62 and 64 belong to respective metal layers. The side portions 62 and 64 are formed in a plurality of metal layers. As one example illustrated in FIG. 9, the side portions 62 and 64 are formed in six consecutive metal layers.

In one embodiment, the side portions 62 and 64 each span in a plane defined by the Y axis and the Z axis. Furthermore, the side portions 62 and 64 are defined in an area aligned with the array of the conductive features 42a and 44a when viewed in the X direction.

The conductive features 42a extend in the X direction and connect to the side portion 62. The conductive features 44a extend in the X direction and connect to the side portion 64. It is understood that in other embodiments, the anode component 42 may have the side portion 62 positioned at the right side and connected to the conductive features 42a, and the cathode component 42 may have the side portion 64 positioned at the left side and connected to the conductive features 44a. In other embodiments, the side portions may also have alternative shapes and designs.

Figure 10:
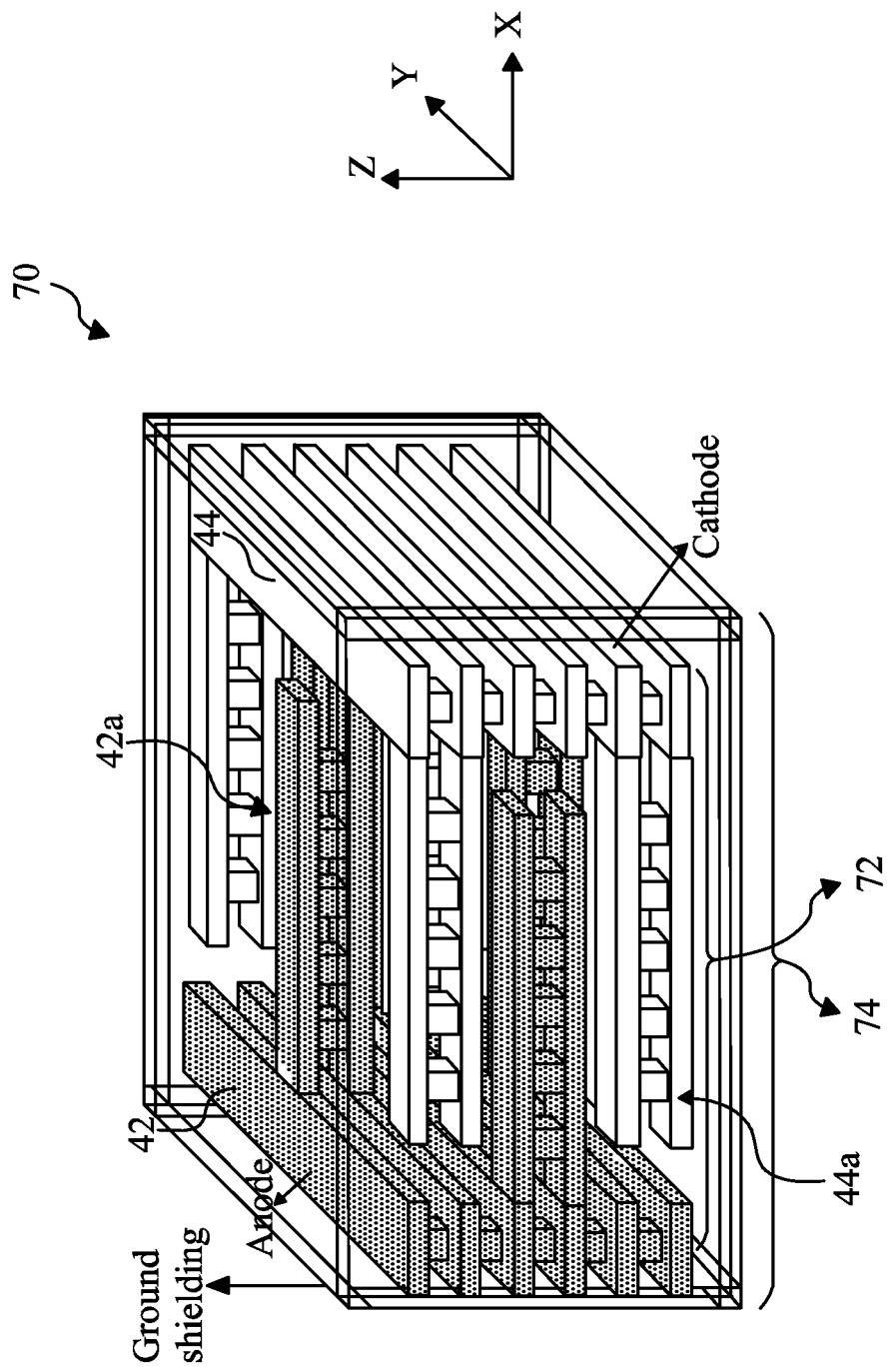
FIG. 10 is a perspective view of a semiconductor device having a capacitor and a shield structure in one embodiment.

FIG. 10 is a fragmentary perspective view of a semiconductor structure 70 having an interdigitated capacitor 72 and a shield structure 74 surrounding the capacitor 72 constructed according to aspects of the present disclosure in one or more embodiments.

In one embodiment, the capacitor 72 is similar to the capacitor 60 of FIG. 9. Particularly, the capacitor structure 72 includes an anode component 42 and a cathode component 44. The anode component 42 and the cathode component 44 respectively serve as anode and cathode terminals of the capacitor structure 72, so that an electrical voltage can be applied through the anode and cathode terminals. The anode component 42 and the cathode component 44 each include a plurality of conductive features. Particularly, the anode component 42 includes a plurality of first conductive features 42a. The cathode component 44 includes a plurality of second conductive features 44a. The first conductive features 42a are interdigitated with the second conductive features 44a along both the Y axis and the Z axis. In one example, the conductive features 42a and 44a each may has a structure of the conductive feature 50 of FIG. 6.

The semiconductor structure 70 includes the shield structure 74 surrounding the capacitor 72 configured to provide a shield function such that the capacitor 72 is electrically shield from the substrate and other conductive features (such as a portion of the interconnect structure) approximate the capacitor 72. Therefore, the induced energy loss is substantially reduced and the quality factor of the capacitor 72 is substantially increased. In one embodiment, the shield structure 74 is electrically grounded.

Figure 11:
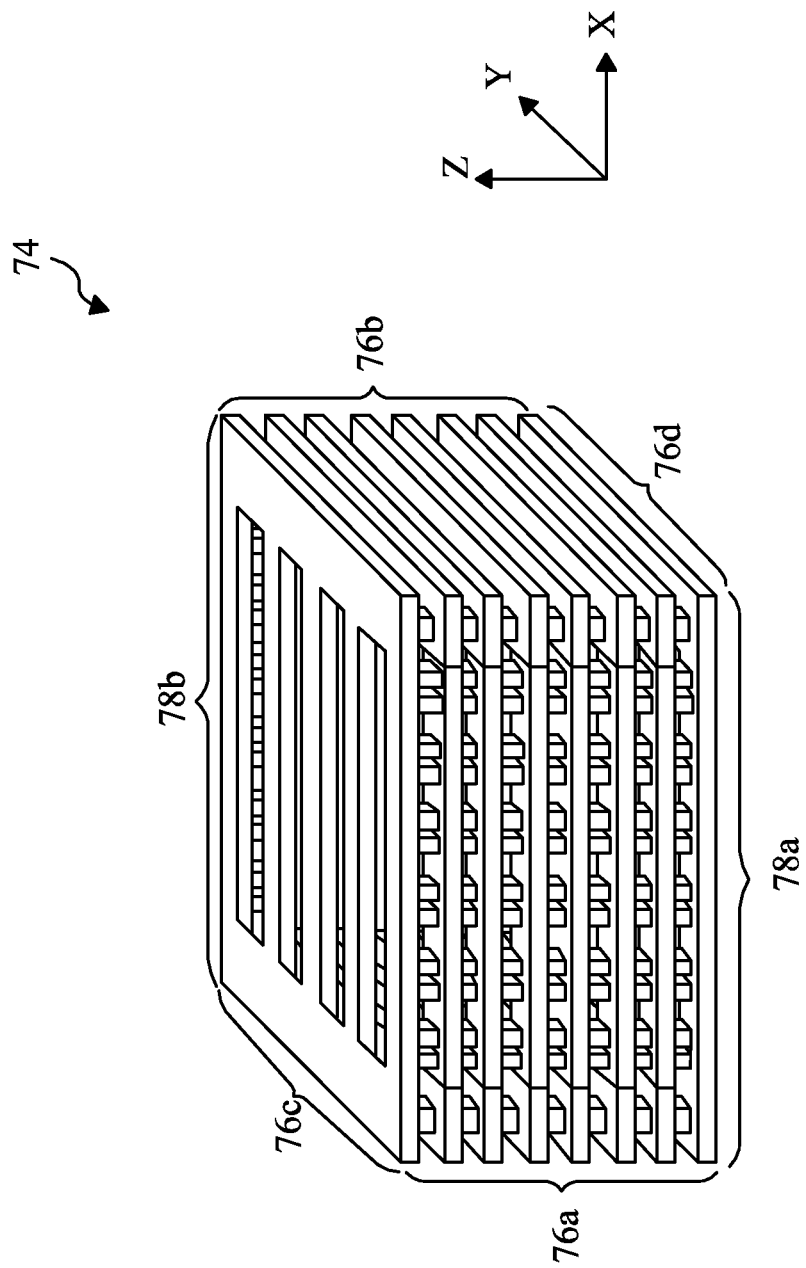
FIG. 11 is a perspective view of the shield structure in the semiconductor device of FIG. 10 according to one embodiment.
Figure 12:
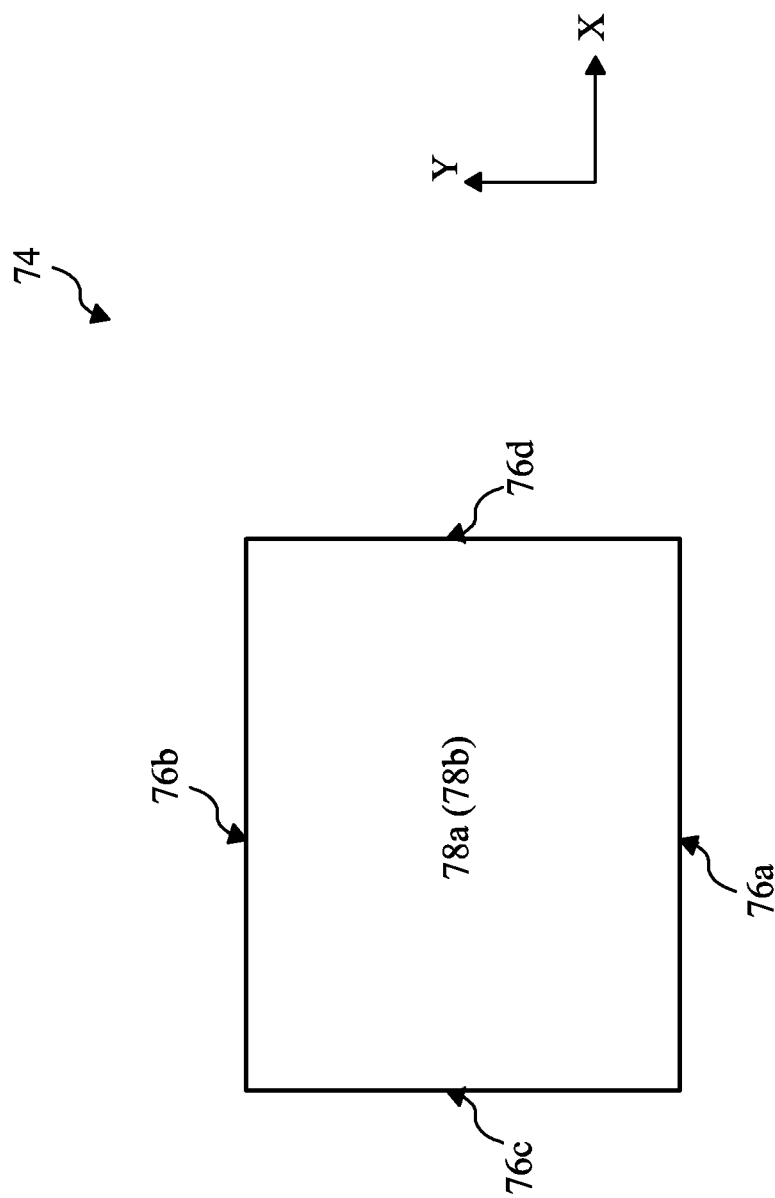
FIG. 12 is a diagrammatic top view of the shield structure in the semiconductor device of FIG. 10 according to one embodiment.

The shield structure 74 is further described with reference to FIGS. 11 and 12. FIG. 11 is a perspective view of the shield structure 74. FIG. 12 is a top view of the shield structure 74 where the detailed structure is eliminated for simplicity. Referring to FIGS. 11 and 12, the shield structure 74 includes vertical features 76 and horizontal features 78 configured to provide an enclosed space where the capacitor 72 is positioned in. Particularly, the vertical feature 76 includes a first side portion 76a and a second side portion 76b spaced along the Y direction. The first side portion 76a and the second portion 76b span along the X direction and Z direction. The vertical feature 76 further includes a third side portion 76c and a fourth side portion 76d spaced along the X direction. The third side portion 76c and the second portion 76d span along the Y direction and Z direction. The horizontal features 78 includes a top portion 78a and a bottom portion 78b spaced along the Z direction. The top portion 78a and the bottom portion 78b span along the X direction and the Y direction. The first side portion 76a, the second side portion 76b, the third side portion 76c, the fourth side portion 76d, the top portion 78a, and the bottom side portion 76a are electrically connected and are configured to enclose the capacitor 72 inside for shield effect.

The side portions 76a and 76b each include a plurality of metal lines interconnected vertically (in the Z-direction) by vias, where the metal lines extend in the X direction. The side portions 76c and 76d each include a plurality of metal lines interconnected vertically (in the Z-direction) by vias, where the metal lines extend in the Y direction. The top portion 78a and bottom portion 78b each include a plurality of metal lines that extend in the X-direction or alternatively in the Y direction. The metal lines of the top portion 78a are metal lines in the same metal layer, and the metal lines of the bottom portion 78b are metal lines in the same metal layer (but a different metal layer than the metal layer of the top portion 78a). In other embodiments, the vertical features 76 and the horizontal features 78 may also have alternative shapes and designs. For example, the via features in the side portions 76a, 76b, 76c and 76d may be designed have equal dimensions in the X and Y directions. Alternatively, those via features may be designed to have an elongated shape in a top view, or via bar. For example, the via features in the first and second side portions 76a and 76b includes a first dimension along the X direction and a second dimension along the Y direction, where the first dimension is substantially greater than the second dimension. In another example, the via features in the third and fourth side portions 76c and 76d includes a first dimension along the Y direction and a second dimension along the X direction, where the first dimension is substantially greater than the second dimension.

Figure 13:
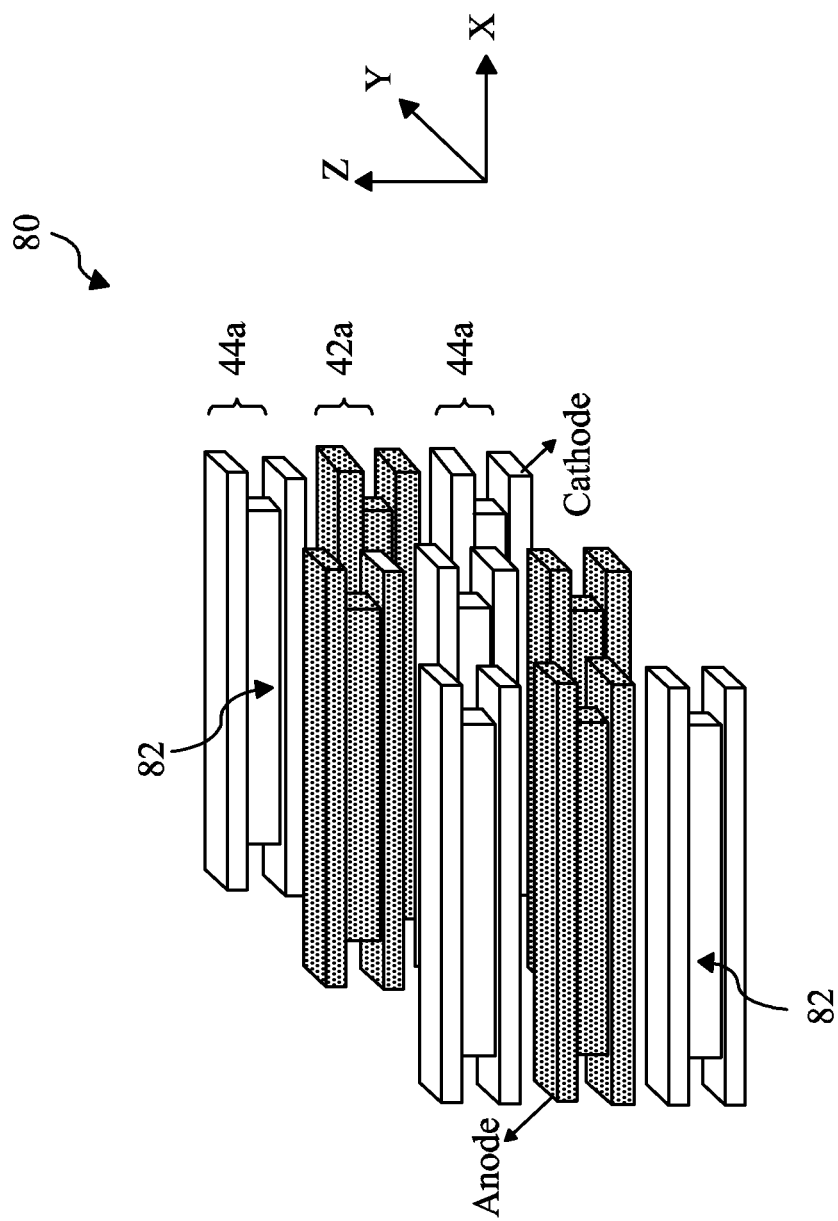
FIG. 13 is a perspective fragmentary view of a semiconductor capacitor in another embodiment.

FIG. 13 is a fragmentary perspective view of a capacitor structure 80 in another embodiment. The capacitor structure 80 is similar to the capacitor structure 40 in FIG. 4. The capacitor structure 40 includes an anode component 42 and a cathode component 44. The anode component 42 and the cathode component 44 each include a plurality of conductive features. Particularly, the anode component 42 includes a plurality of first conductive features 42a. The cathode component 44 includes a plurality of second conductive features 44a. According to various aspects of the present disclosure, these conductive features 42a and 44a each include two metal lines extending along the X axis; and one metal via 82 extending along the Z axis and interconnecting the two metal lines. The via features 82 are designed to have an elongated shape in a top view. The first conductive features 42a are interdigitated with the second conductive features 44a along both the Y axis and the Z axis.

Figure 14:
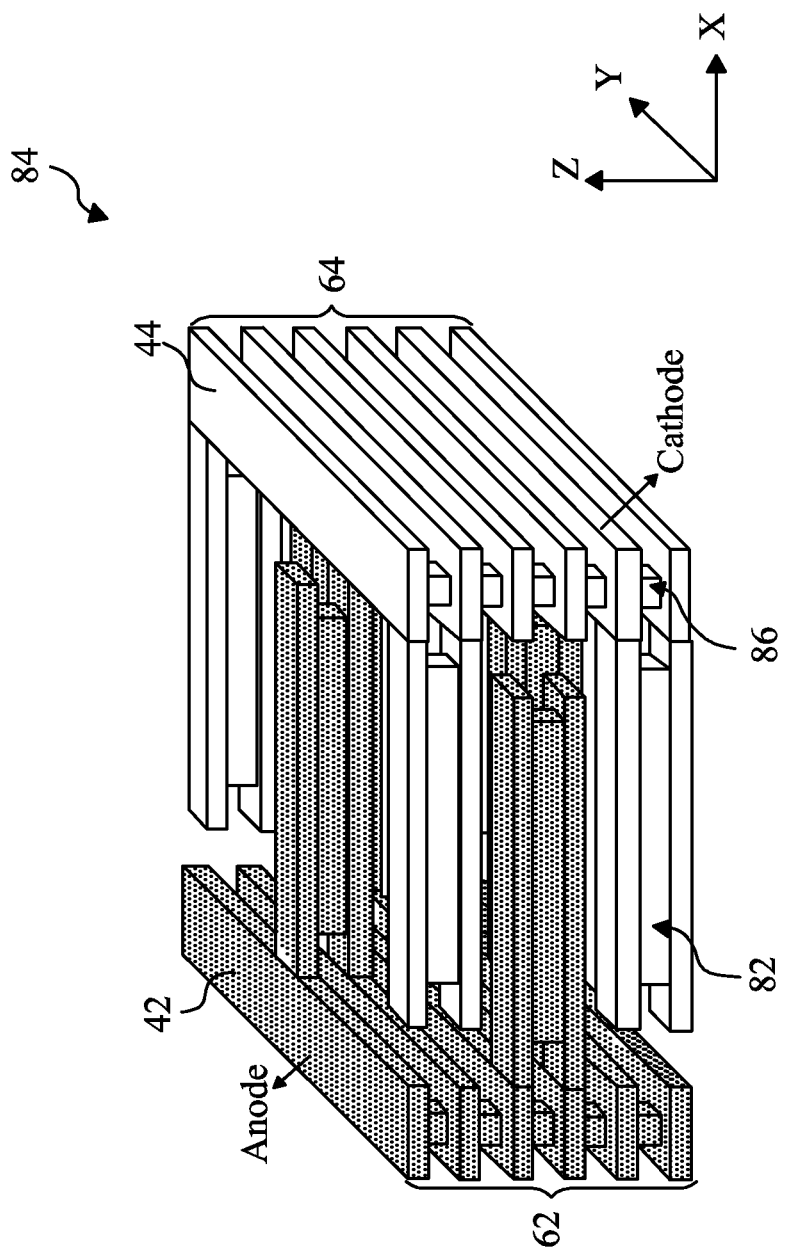
FIG. 14 is a perspective view of a semiconductor capacitor in another embodiment.

FIG. 14 is a fragmentary perspective view of a capacitor structure 84 in another embodiment. The capacitor structure 84 is similar to the capacitor structure 80 in FIG. 13 but further includes side portions. The anode component 42 also includes a side portion 62, and the cathode component 44 also includes a side portion 64. The side portions 62 and 64 each include a plurality of metal lines interconnected vertically (in the Z-direction) by elongated vias 86, where the metal lines extend in the Y direction. The metal lines in the side portions 62 and 64 belong to respective metal layers. The side portions 62 and 64 are formed in a plurality of metal layers. As one example illustrated in FIG. 14, the side portions 62 and 64 are formed in six consecutive metal layers. In one embodiment, the side portions 62 and 64 each span in a plane defined by the Y axis and the Z axis. Furthermore, the side portions 62 and 64 are defined in an area aligned with the array of the conductive features 42a and 44a when viewed in the X direction. The elongated via features 86 are similar to the elongated via features 82 but are oriented along the Y direction. Particularly, the elongated via features 86 includes a first dimension along the Y direction and a second dimension along the X direction, where the first dimension is substantially greater than the second dimension.

Figures 15, 16:
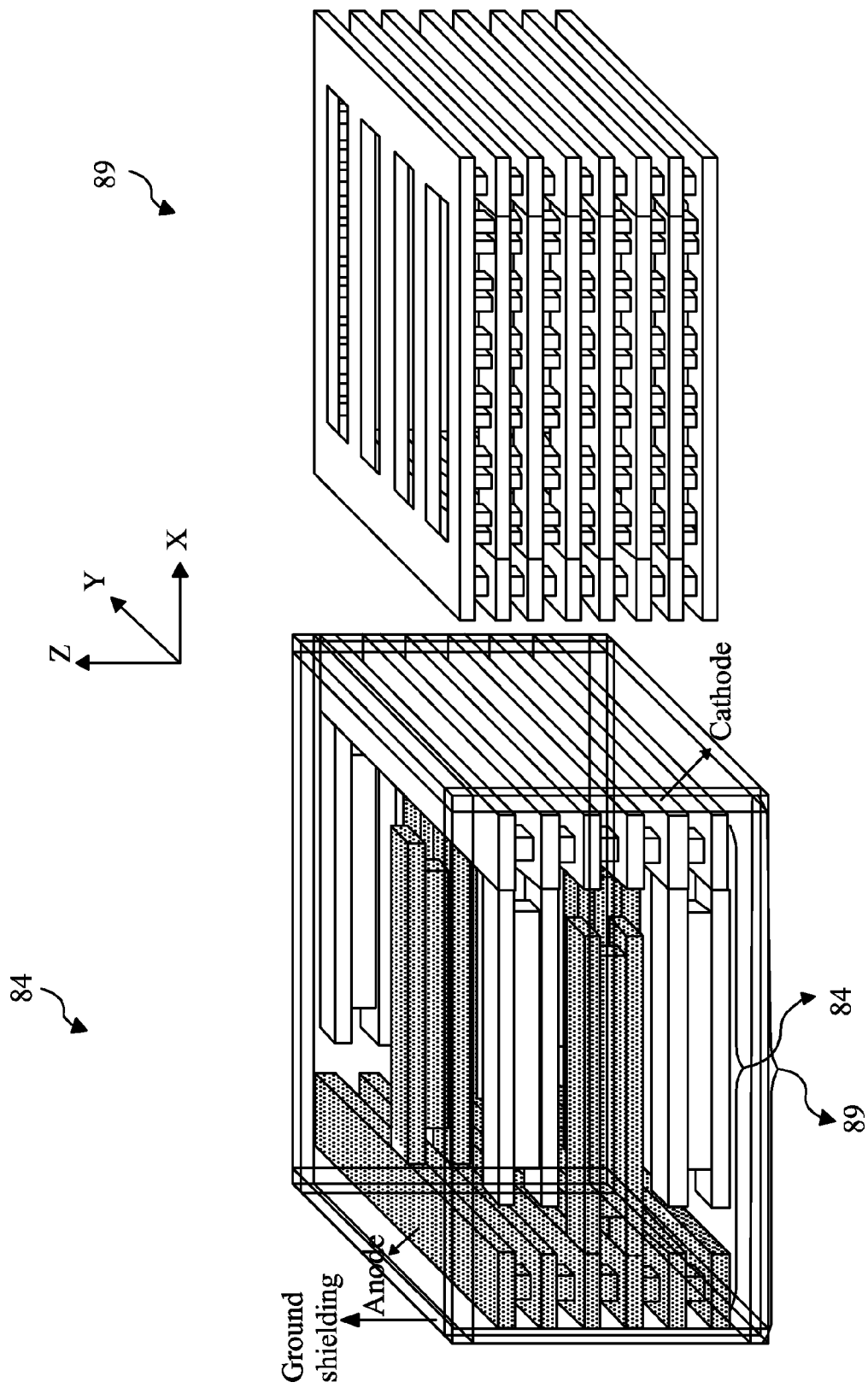
FIG. 15 is a perspective view of a semiconductor device having a capacitor and a shield structure in another embodiment.
FIG. 16 is a perspective view of the shield structure in the semiconductor device of FIG. 15 according to one embodiment.

FIG. 15 is a fragmentary perspective view of a semiconductor structure 88 including the capacitor structure 84 and a shield structure 89 surrounding the capacitor 84. The shield structure 89 is further illustrated in FIG. 16 in a perspective view and is similar to the shield structure 74 in FIG. 11. In an alternative embodiment, the shield structure 89 uses elongated via features similar to the via features 86 in FIG. 14. In another embodiment, the shield structure 89 is electrically grounded.

Figure 17:
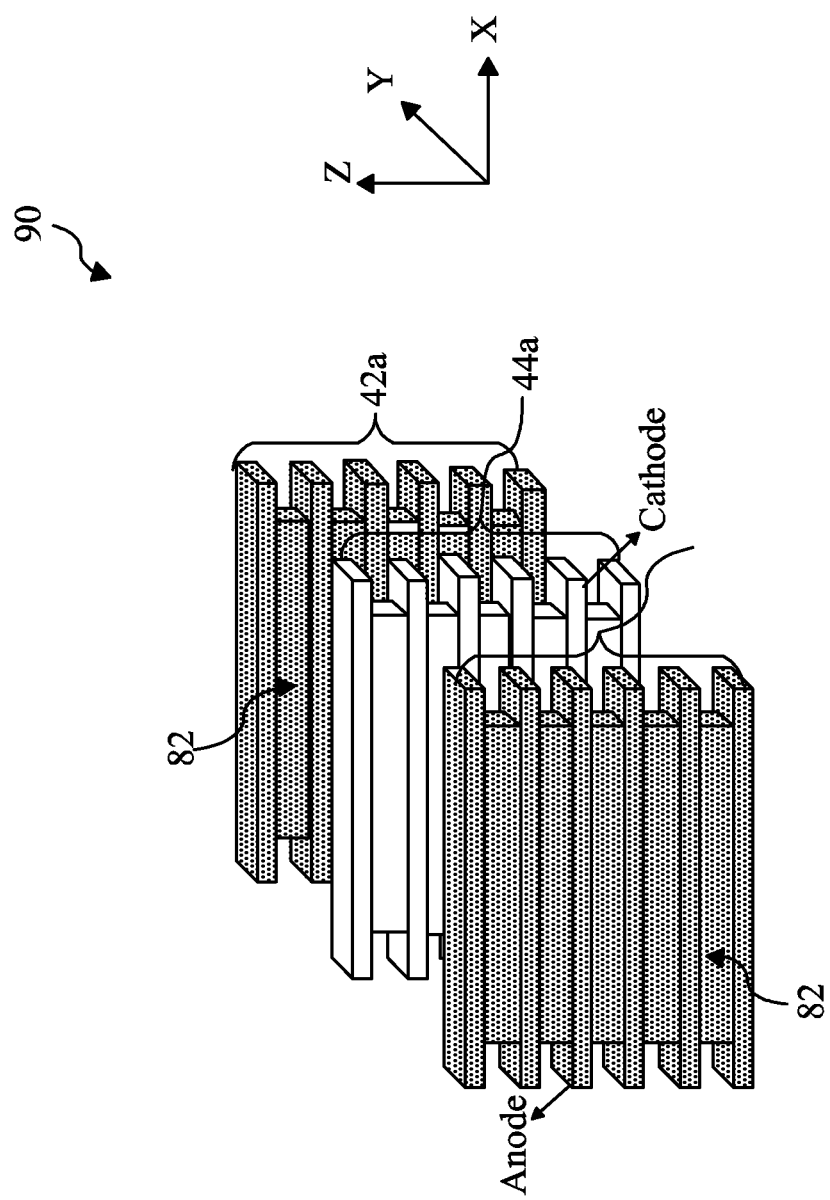
FIG. 17 is a perspective fragmentary view of a semiconductor capacitor in another embodiment.

FIG. 17 is a fragmentary perspective view of a capacitor structure 90 in another embodiment. The capacitor structure 90 is similar to the capacitor structure 80 in FIG. 13. The capacitor structure 40 includes an anode component 42 and a cathode component 44. The anode component 42 and the cathode component 44 each include a plurality of conductive features. Particularly, the anode component 42 includes a plurality of first conductive features 42a. The cathode component 44 includes a plurality of second conductive features 44a. However, these conductive features 42a and 44a each include a plurality of metal lines extending along the X axis; and metal vias 82 extending along the Z axis and interconnecting neighbor metal lines. The via features 82 are designed to have an elongated shape in a top view. The elongated via features 82 includes a first dimension along the X direction and a second dimension along the Y direction, where the first dimension is substantially greater than the second dimension. Furthermore, the first conductive features 42a are interdigitated with the second conductive features 44a along the Y axis.

Figure 18:
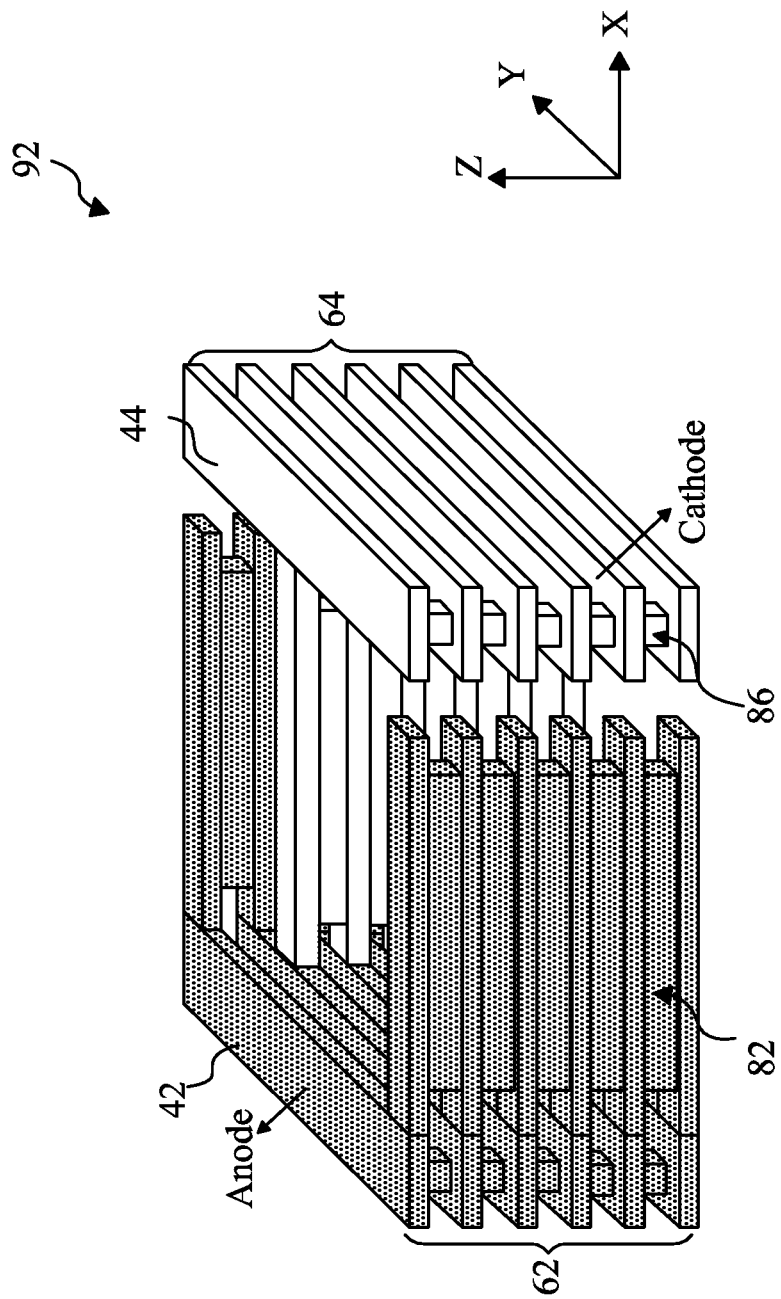
FIG. 18 is a perspective fragmentary view of a semiconductor capacitor in another embodiment.

FIG. 18 is a fragmentary perspective view of a capacitor structure 92 in another embodiment. The capacitor structure 92 is similar to the capacitor structure 90 in FIG. 17 but further includes side portions. The anode component 42 also includes a side portion 62, and the cathode component 44 also includes a side portion 64. The side portions 62 and 64 each include a plurality of metal lines interconnected vertically (in the Z-direction) by vias 86, where the metal lines extend in the Y direction. In one embodiment, the via features 86 are designed with an elongated shape as well. The metal lines in the side portions 62 and 64 belong to respective metal layers. The side portions 62 and 64 are formed in a plurality of metal layers. As one example illustrated in FIG. 18, the side portions 62 and 64 are formed in six consecutive metal layers. In one embodiment, the side portions 62 and 64 each span in a plane defined by the Y axis and the Z axis. Furthermore, the side portions 62 and 64 are defined in an area aligned with the array of the conductive features 42a and 44a when viewed in the X direction. The elongated via features 86 are similar to the elongated via features 82. Particularly, the elongated via features 86 includes a first dimension along the Y direction and a second dimension along the X direction, where the first dimension is substantially greater than the second dimension.

Figures 19, 20:
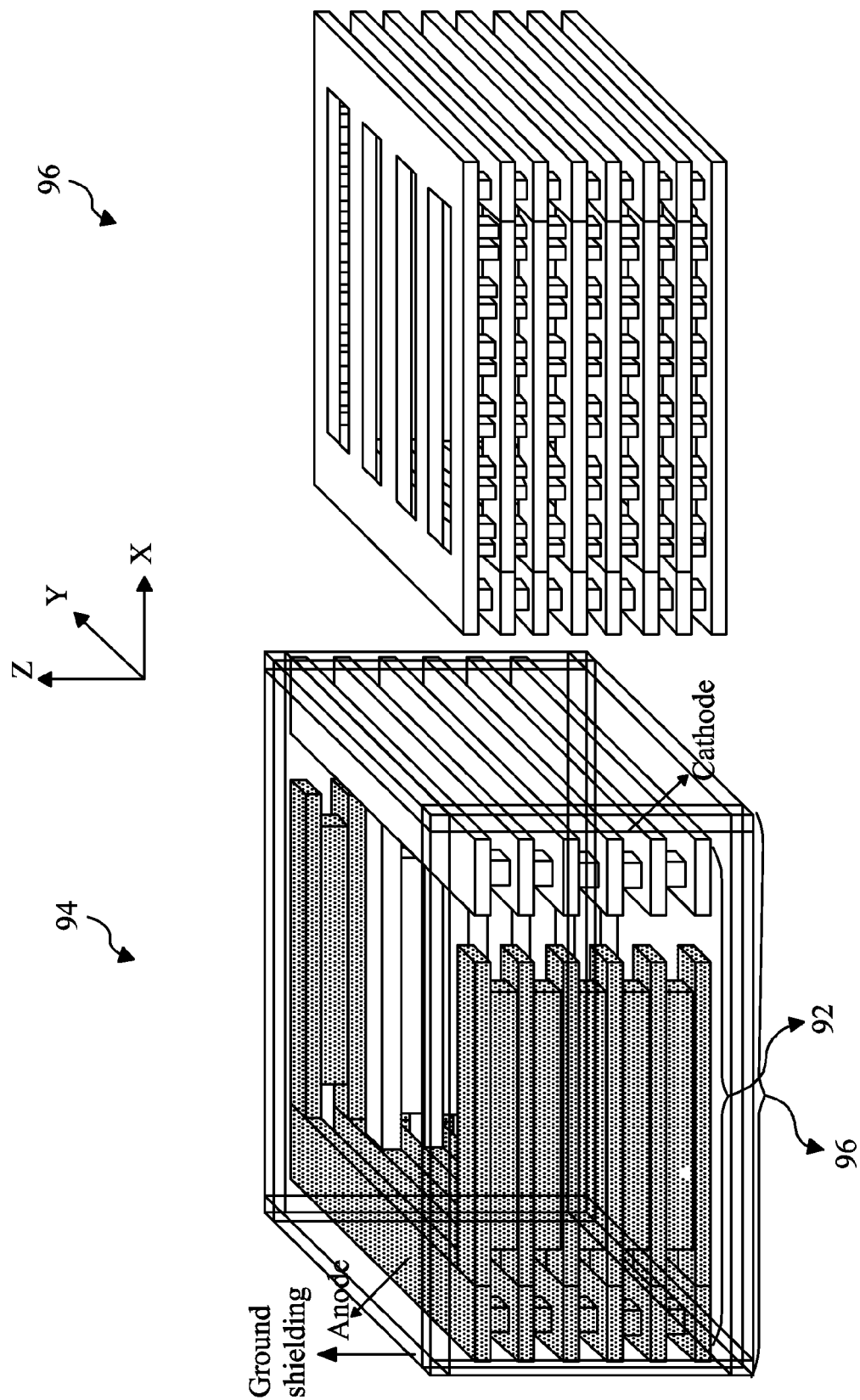
FIG. 19 is a perspective view of a semiconductor device having a capacitor and a shield structure in another embodiment.
FIG. 20 is a perspective view of the shield structure in the semiconductor device of FIG. 19 according to one embodiment.

FIG. 19 is a fragmentary perspective view of a semiconductor structure 94 including the capacitor structure 92 (as shown in FIG. 18) and a shield structure 96 surrounding the capacitor 92. The shield structure 96 is further illustrated in FIG. 20 in a perspective view and is similar to the shield structure 74 of FIG. 11. In an alternative embodiment, the shield structure 96 uses elongated via features similar to the via features 86 in FIG. 18. In another embodiment, the shield structure 96 is electrically grounded.

Although various embodiments are described, other embodiments of the capacitor having conductive features configured in an interdigitated manner or the capacitor having elongated via features may be used according to the present disclosure. In one example, the shield structure may include a subset of the side portions, the top portion and the bottom portion. In another example, elongated vias may be used in the conductive features of the anode and cathode components, the side portions of the anode and cathode components, the shield structure or combinations thereof. It is understood that additional processes may be performed to complete the fabrication of the capacitor structure. For example, these additional processes may include deposition of passivation layers, packaging, and testing. For the sake of simplicity, these additional processes are not described herein.

A semiconductor device is disclosed according to one of the broader forms of the present disclosure. In one embodiment, the semiconductor device includes a substrate having a surface that is defined by a first axis and a second axis perpendicular to the first axis; and a capacitor disposed on the substrate, the capacitor having an anode component that includes a plurality of first conductive features and a cathode component that includes a plurality of second conductive features. The first conductive features and the second conductive features each include two metal lines extending along the first axis; and at least one metal via extending along a third axis that is perpendicular to the surface of the substrate and interconnecting the two metal lines; and the first conductive features are interdigitated with the second conductive features along both the second axis and the third axis.

In one embodiment, the metal via includes a first dimension along the first axis and a second dimension along the second axis, the first dimension being substantially equal the second dimension. In another embodiment, the metal via includes a first dimension along the first axis and a second dimension along the second axis, the first dimension being substantially greater than the second dimension.

In another embodiment, an interconnect structure having a plurality of interconnect layers is disposed over the substrate, and the two metal lines belong to two neighbor metal layers and are distanced from each other along the third axis. The metal lines each have a first dimension along the first axis greater than a second dimension along the second axes.

In another embodiment, the first conductive features and the second conductive features form a two-dimension array in a sectional view along the first axis; and the array contains a subset of first and second conductive features aligned along the second axis and another subset of first and second conductive features aligned along the third axis.

In another embodiment, the anode component further includes a first side portion connecting with the first conductive features; the cathode component further includes a second side portion connecting with the second conductive features; the first and second side portions each span along both the second axis and the third axis, and the first and second conductive features are disposed between the first and second side portions. In furtherance of the embodiment, the first and second side portions each include a plurality of metal lines each belong to a different metal layer of an interconnect structure; and a plurality of groups of metal vias each group of metal vias interconnect two of the plurality of metal lines along the third axis.

In another embodiment, the semiconductor device further includes a shield structure that completely surrounds the capacitor and is configured to be grounded. In furtherance of this embodiment, the shield structure includes a bottom portion; a first side portion and a second side portion distanced along the first axis; and a third side portion and a fourth side portion distanced along the second axis, where the capacitor is enclosed by the top portion, the bottom portion, the first portion, the second portion, the third portion and the fourth portion.

In various embodiments, the shield structure includes a top portion, wherein the top portion and the bottom portion each include a respective conductive element that belongs to a metal layer of an interconnect structure. The conductive element may includes a plurality of metal lines each extending along one of the first axis and the second axis.

In another embodiment, each of first, second, third and fourth side portions includes a plurality of metal lines interconnected along the third axis by a plurality of metal vias, and wherein the metal lines each extend along the second axis.

The present disclosure also provides another embodiment of a semiconductor device. The semiconductor device includes a substrate having a surface that is defined by a first axis and a second axis perpendicular to the first axis; and a capacitor disposed on the substrate, the capacitor having an anode component that includes a plurality of first conductive features and a cathode component that includes a plurality of second conductive features. The first conductive features are interdigitated with the second conductive features along the second axis. The first conductive features and the second conductive features each include a plurality of metal lines extending along the first axis; and a plurality of metal vias each interconnecting two of the metal lines along a third axis perpendicular to the surface of the substrate. Each of the metal vias includes a first dimension along the first axis and a second dimension along the second axis, the first dimension being substantially greater than the second dimension.

In one embodiment, an interconnect structure having a plurality of interconnect layers is disposed over the substrate, and the metal lines each belong to a respective metal layer, and the metal lines each have a first dimension along the first axis greater than a second dimension along the second axes.

In another embodiment, the anode component further includes a first side portion connecting with the first conductive features; the cathode component further includes a second side portion connecting with the second conductive features; the first and second side portions each span along both the second axis and the third axis, and the first and second conductive features are disposed between the first and second side portions.

In another embodiment, the semiconductor device further includes a shield structure configured to be grounded. The shield structure includes a top portion and a bottom portion; a first side portion and a second side portion distanced along the first axis; and a third side portion and a fourth side portion distanced along the second axis. The capacitor is enclosed by the top portion, the bottom portion, the first portion, the second portion, the third portion and the fourth portion.

In furtherance of the above embodiment, the top portion and the bottom portion each include a respective conductive element that belongs to a metal layer of an interconnect structure. Each of first, second, third and fourth side portions includes a second plurality of metal lines interconnected along the third axis by a second plurality of metal vias. The second metal lines each extend along the second axis.

The present disclosure also provides another embodiment of a method of fabricating a semiconductor device. The method includes providing a substrate having a surface that is defined by a first axis and a second axis that is perpendicular to the first axis; and forming an interconnect structure over the surface of the substrate, the interconnect structure having a layers of conductive lines and a levels of conductive vias interconnecting the layers of conductive lines. The forming the interconnect structure includes forming a capacitor with a subset of the conductive lines and a subset of the conductive vias, the capacitor having an anode component that includes a plurality of first conductive features and a first side portion connecting the first conductive features and a cathode component that includes a plurality of second conductive features and a second side portion connecting the second conductive features. The first conductive features and the second conductive features each extend along the first axis. The first conductive feature are formed to be interdigitated with the second conductive features along the second axis. The first and second side portions each span along both the second axis and a third axis perpendicular to the surface. The first and second conductive features are disposed between the first and second side portions.

In one embodiment of the method, the forming the capacitor further includes forming a shield structure that has a top portion and a bottom portion; a first side portion and a second side portion distanced along the first axis; and a third side portion and a fourth side portion distanced along the second axis. The capacitor is enclosed by the top portion, the bottom portion, the first portion, the second portion, the third portion and the fourth portion.

In another embodiment, the forming the capacitor includes forming the metal vias each with a first dimension along the first axis and a second dimension along the second axis, the first dimension being substantially greater than the second dimension.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate having a surface that is defined by a first axis and a second axis perpendicular to the first axis; and
a capacitor disposed on the substrate, the capacitor having an anode component that includes a plurality of first conductive features and a first side portion connecting with the first conductive features and a cathode component that includes a plurality of second conductive features and a second side portion connecting with the second conductive features, wherein the first conductive features and the second conductive features each include:
two metal lines extending along the first axis, and
at least one metal via extending along a third axis that is perpendicular to the surface of the substrate and interconnecting the two metal lines;
the first conductive features are interdigitated with the second conductive features along both the second axis and the third axis; and
the first side portion and the second side portion include:
two conductive lines extending along the second axis; and
at least one conductive via extending along the third axis and interconnecting the two conductive lines extending along the second axis.

2. The semiconductor device of claim 1, wherein the metal via includes a first dimension along the first axis and a second dimension along the second axis, the first dimension being substantially equal to the second dimension.

3. The semiconductor device of claim 1, wherein the metal via includes a first dimension along the first axis and a second dimension along the second axis, the first dimension being substantially greater than the second dimension.

4. The semiconductor device of claim 1, wherein the two metal lines belong to two neighbor metal layers and are distanced from each other along the third axis.

5. The semiconductor device of claim 4, wherein the metal lines each have a first dimension along the first axis greater than a second dimension along the second axis.

6. The semiconductor device of claim 1, wherein:
the first conductive features and the second conductive features form a two-dimension array in a sectional view along the first axis; and
the array contains a subset of first and second conductive features aligned along the second axis and another subset of first and second conductive features aligned along the third axis.

7. The semiconductor device of claim 1, wherein:
the first and second conductive features are disposed between the first and second side portions.

8. The semiconductor device of claim 7, wherein:
the metal lines of the first and second side portions belong to a different metal layer of an interconnect structure.

9. The semiconductor device of claim 1, further comprising a shield structure that completely surrounds the capacitor and is configured to be grounded.

10. The semiconductor device of claim 9, wherein the shield structure includes:
a bottom portion;
a first side portion and a second side portion distanced along the first axis; and
a third side portion and a fourth side portion distanced along the second axis, wherein the capacitor is enclosed by the bottom portion, the first side portion, the second side portion, the third side portion, and the fourth side portion.

11. The semiconductor device of claim 10, wherein the shield structure includes a top portion, wherein the top portion and the bottom portion each include a respective conductive element that belongs to a metal layer of an interconnect structure.

12. The semiconductor device of claim 11, wherein the conductive element includes a plurality of metal lines each extending along one of the first axis and the second axis.

13. The semiconductor device of claim 10, wherein each of the first, second, third and fourth side portions includes a plurality of metal lines interconnected along the third axis by a plurality of metal vias, and wherein the metal lines each extend along the second axis.

14. A method of fabricating a semiconductor device, comprising:
providing a substrate having a surface that is defined by a first axis and a second axis that is perpendicular to the first axis; and
forming an interconnect structure over the surface of the substrate, the interconnect structure having layers of conductive lines and levels of conductive vias interconnecting the layers of conductive lines, wherein the forming the interconnect structure includes:
forming a capacitor with a subset of the conductive lines and a subset of the conductive vias, the capacitor having an anode component that includes a plurality of first conductive features and a first side portion connecting the first conductive features and a cathode component that includes a plurality of second conductive features and a second side portion connecting the second conductive features, wherein:
the first conductive features and the second conductive features each extend along the first axis,
the first and second conductive features are comprised of two of the conductive lines interconnected by at least one of the conductive vias,
the first conductive features are formed to be interdigitated with the second conductive features along the second axis,
the first and second side portions each span along both the second axis and a third axis perpendicular to the surface, and
the first and second conductive features are disposed between the first and second side portions;
the first side portion and the second side portion include:
two metal lines extending along the second axis; and
at least one metal via extending along the third axis and interconnecting the two metal lines extending along the second axis.

15. The method of claim 14, wherein the forming the capacitor further includes forming a shield structure having:
a top portion and a bottom portion;
a first side portion and a second side portion distanced along the first axis; and
a third side portion and a fourth side portion distanced along the second axis, wherein the capacitor is enclosed by the top portion, the bottom portion, the first side portion, the second side portion, the third side portion, and the fourth side portion.

16. The method of claim 14, wherein the forming the capacitor includes forming the conductive vias each with a first dimension along the first axis and a second dimension along the second axis, the first dimension being substantially greater than the second dimension.

17. A semiconductor device, comprising:
a substrate having a surface that is defined by a first axis and a second axis perpendicular to the first axis;
an interconnect structure having a plurality of interconnect layers disposed over the substrate;
a capacitor formed in the interconnect structure, the capacitor having an anode component that includes a plurality of first conductive features and a cathode component that includes a plurality of second conductive features, wherein the first conductive features and the second conductive features each include:
two metal lines extending along the first axis, wherein the two metal lines belong to two neighbor metal layers of the interconnect structure and are distanced from each other along a third axis that is perpendicular to the surface of the substrate, and
at least one metal via extending along the third axis and interconnecting the two metal lines; and
the first and second conductive features are arranged in a two dimensional array along both the second axis and the third axis, wherein the first and second conductive features alternate along both the second axis and the third axis;
the anode component further includes a first side portion connecting with the first conductive features;
the cathode component further includes a second side portion connecting with the second conductive features;
the first side portion and the second side portion include:
two conductive lines extending along the second axis; and at least one conductive via extending along the third axis and interconnecting the two conductive lines extending along the second axis.

18. The semiconductor device of claim 17, wherein the metal via includes a first dimension along the first axis and a second dimension along the second axis, the first dimension being substantially equal to the second dimension.

19. The semiconductor device of claim 17, wherein the metal via includes a first dimension along the first axis and a second dimension along the second axis, the first dimension being substantially greater than the second dimension.

20. The semiconductor device of claim 17, wherein
the first and second side portions each span along both the second axis and the third axis; and
the first and second conductive features are disposed between the first and second side portions.

21. The semiconductor device of claim 17, further comprising a shield structure configured to be grounded, wherein the shield structure includes:
a top portion and a bottom portion;
a first side portion and a second side portion distanced along the first axis; and
a third side portion and a fourth side portion distanced along the second axis, wherein the capacitor is enclosed by the top portion, the bottom portion, the first side portion, the second side portion, the third side portion, and the fourth side portion.

* * * * *